United States Patent [19]

Ichihashi et al.

[11] Patent Number: 5,213,915

[45] Date of Patent: May 25, 1993

[54] HOLOGRAPHIC RECORDING MATERIAL AND METHOD FOR HOLOGRAPHIC RECORDING

[75] Inventors: Taichi Ichihashi, Osaka; Hideo Tanigawa, Ikeda; Akira Nagata, Osaka, all of Japan

[73] Assignee: Agency of Industrial Science & Technology, Ministry of International Trade & Industry, Tokyo, Japan

[21] Appl. No.: 857,439

[22] Filed: Mar. 25, 1992

Related U.S. Application Data

[62] Division of Ser. No. 488,896, Mar. 6, 1990, abandoned.

[30] Foreign Application Priority Data

May 19, 1989 [JP] Japan ................................. 1-127686
Jul. 3, 1989 [JP] Japan ................................. 1-172635

[51] Int. Cl.$^5$ .............................................. G03H 1/04
[52] U.S. Cl. ............................................ 430/2; 430/1; 430/290
[58] Field of Search ............................... 430/1, 2, 290

[56] References Cited

U.S. PATENT DOCUMENTS

| | | | |
|---|---|---|---|
| 4,879,318 | 11/1989 | Lipscomb et al. | 522/181 X |
| 4,959,297 | 9/1990 | Palazzotto | 430/281 X |
| 5,026,618 | 6/1991 | Kushibiki et al. | 430/1 X |

FOREIGN PATENT DOCUMENTS

| | | | |
|---|---|---|---|
| 0324481 | 7/1989 | European Pat. Off. | 430/2 |
| 58-186976 | 11/1983 | Japan | 522/181 |

OTHER PUBLICATIONS

Display Hologram Handbook, 1985, pp. 66–67, G. Shokan.
Optical Engineering Handbook, 1986, pp. 351–353.
Applied Optics, vol. 15, No. 2, Feb. 1976, pp. 534–541, W. J. Tomlinson, et al, "Multicomponent Photopolymer Systems for Volume Phase Holograms and Grating Devices".

*Primary Examiner*—Cynthia Hamilton
*Attorney, Agent, or Firm*—Oblon, Spivak, McClelland, Maier & Neustadt

[57] ABSTRACT

A holographic recording material consisting of diethylene glycol-bis(allyl carbonate), 2,2-bis[3,5-dibromo-4-(2-methacryloyloxyethoxy)phenyl]propane, and a photopolymerization initiator. A method for holographic recording, which comprises interposing the holographic recording material between two opposed surface materials, heating the interposed holographic recording material thereby solidifying the recording material and giving rise to a dry plate, and then exposing the dry plate to a coherent light.

9 Claims, No Drawings

HOLOGRAPHIC RECORDING MATERIAL AND METHOD FOR HOLOGRAPHIC RECORDING

This is a division, of application Ser. No. 07/488,896, filed on Mar. 6, 1990, now abandoned.

BACKGROUND OF THE INVENTION

1. Field of the Invention

This invention relates to a holographic recording material and a method for holographic recording by the use of the material.

2. Prior Art Statement

A "hologram" is a photosensitive material on which an interference pattern formed using coherent light such as laser light has recorded. The holograms are now used for the formation of three-dimensional images and as optical elements. The characteristics which the holographic recording material is required to possess include, for example, sensitivity to laser beams such as of He-Ne (wavelength 633 nm), Ar (wavelength 515 and 488 nm), and He-Cd (wavelength 442 nm), high efficiency of holographic diffraction, high resolution, simplicity of developing treatment. Among the photosensitive materials in practical use, there are known plates of dichromic acid gelatin and bleached dry plates of silver salts of the type used as ordinary photographic materials. These materials have been reported by Masato Nakashima and Kazuo Hanano in "Display Hologram Handbook", pages 66 and 67, Gyoin Shokan (1985) and Terutsugu Ose, Hiroyoshi Saito, Shunichi Tanaka, Jumpei Tsujiuchi, and Takeshi Namioka in "Optical Engineering Handbook", pages 351 to 353, Asakura Shoten (1986), for example.

The conventional photosensitive materials, however, have a disadvantage in that the manufacture of a hologram entails complicated treatments and the holograms made of such materials require a wet developing treatment, though silver salts possess high sensitivity and dichromate gelatin possesses high diffraction efficiency. As means of overcoming this problem, a method using a photopolymerization type recording material formed mainly of two kinds of monomer mixtures has been proposed [W. J. Tomlinson et al, "Appl. Opt. Vol. 15, 534 (1976)]. This method effects holographic recording in the recording material by photopolymerizing the recording material falling in the part of an interference pattern high in luminous energy thereby causing modulation in refractive index in that part. The recording material falling in the part of the interference pattern low in luminous energy, however, remains as unreacted monomer. The pattern recorded on the recording material, if any, must therefore, be stabilized by having the entire surface of the recording material exposed to ultraviolet light, for example. Besides, this recording material is disadvantageous in that it is deficient in such practical properties as sensitivity to laser beam, diffraction efficiency, and resolution.

In the circumstances, there is a strong need to develop a holographic recording material excelling in sensitivity to laser beam, diffraction efficiency, and resolution as well as a method for holographic recording.

SUMMARY OF THE INVENTION

This invention responds to this desire.

The present inventors continued a study in search of a composition of a photopolymerizable material containing a multiplicity of monomers abounding in photoreactivity and refractive index and varying in kind. They have found consequently that when an allyl group-containing monomer and a bromine substituted aromatic monomer, both ignored heretofore as possessing low polymerizability, are combined, a hologram excellent in various properties is obtained simply by an operation of exposure. This invention has been completed as the result.

This invention is directed to a holographic recording material containing diethylene glycol-bis(allyl carbonate), 2,2-bis[3,5-dibromo-4-(2-methacryloyloxyethoxy)-phenyl] propane, and a photopolymerization initiator and to a method for holographic recording which comprises heat-treating the material thereby solidifying it and exposing this material to coherent light.

DETAILED DESCRIPTION OF THE PREFERRED EMBODIMENTS

In the holographic recording material contemplated by this invention, the diethylene glycolbis(allyl carbonate) which is used as a principal monomer possesses two allyl groups in the molecular structure thereof, sparingly undergoes photopolymerization, and therefore functions as a poorly reactive monomer. The resin produced by homopolymerizing this monomer has a refractive index of about 1.5. This monomer is liable to copolymerize easily with a bromine substituted acrylic or methacrylic type aromatic monomer in particular.

The 2,2-bis[3,5-dibromo-4-(2-methacryloyloxyethoxy)phenyl]propane which is used as an auxiliary monomer possesses two methacryl groups at the terminal of the molecular structure thereof and functions as a highly reactive monomer rich in photopolymerizability. The resin obtained by homopolymerizing this monomer possesses a refractive index in the neighborhood of 1.6.

The mixing ratio of the principal monomer to the auxiliary monomer is in the range of 3:7 to 7:3. If the mixing ratio deviates from this range, the produced recording material does not easily exhibit a high diffraction efficiency during recording.

The photopolymerization initiator to be used herein is of a kind which emits a radical on absorbing the laser beam such as of He-Ne (wavelength 633 nm), Ar (wavelengths 515 and 488 nm), and He-Cd (wavelength 442 nm). The photopolymerization initiators which are well known in the art include combinations of such radical-generating agents as halogens, aromatic ketones, and peroxides with pigments. Concrete examples are benzil-Michler's ketone, benzil-acridine yellow, halogen compounds-merocyanine, and the like. The amounts of the photopolymerization initiator and the pigment to be added are each approximately in the range of 0.3 to 10% by weight, based on the total amount of the monomers. Optionally, an amine type compound may be employed as a photopolymerization accelerator.

Besides, for the purpose of adjusting the viscosity of the mixture of the principal monomer and the auxiliary monomer and enhancing the mutual compatibility of the comonomers, a photopolymerizable monomer which is liquid at room temperature may be incorporated in the mixture up to an amount equalling the total amount of the principal and auxiliary monomers. The photopolymerizing monomers usable for this purpose include styrene, 2,2-bis(4-methacryloyl-oxyphenyl)propane, 3-phenoxy-2-hydroxypropyl acrylate, and pentaerythritol triacrylate, for example. The incorporation of this photopolymerizing monomer brings about an additional advantage of improving the quality of the produced recording film. An organic solvent may be added in a small amount approximately in the range of 0.5 to 20% by weight for the same purpose. The organic solvents which are usable include toluene, xylene, acetone, and methyl ethyl ketone, for example.

The production of a hologram with the recording material of this invention is accomplished by the conventional method well known in the art.

Now, the method for holographic recording with the holographic recording material of this invention mentioned above will be described.

The holographic recording material of this invention mentioned above can be used for the formation of a hologram by the known method mentioned above. Since this recording material is liquid at room temperature, it entails the following problem in the manufacture of a dry plate necessary for holographic recording. When this recording material is poured into a space between opposed surface materials of glass or plastic, there arises the possibility that the surface materials will shift after exposure and thus degrade recorded pattern. The method of recording according with this invention is aimed at eliminating this disadvantage.

Specifically, the method of this invention essentially consists of interposing the recording material between two opposed surface materials, solidifying the recording material in situ by application of heat thereby giving rise to a dry plate, and exposing the dry plate to coherent light.

The surface materials are glass plates, plastic plates, or plastic films which are excellent in transparency.

The heat treatment for the solidification is carried out after the holographic recording material has been poured into the intervening space between the two opposed surface materials, by allowing the holographic recording material as interposed between the surface materials to stand within an oven kept at a temperature in the range of 50° C. to 200° C. for a period in the range of several minutes to some tens of minutes. When the consequently solidified recording material as clamped between the surface materials is removed from the oven and allowed to cool to room temperature, the solidified recording material does not shed any monomer crystals and the surface materials do not slip out of place. Then, the hologram is made using this dry plate.

Now, the characteristics of the holographic recording material will be described below.

When the holographic recording material of this invention is exposed through a given interference pattern to the incident light, first in the part of high luminous energy, the highly reactive monomer preferentially polymerizes with reduction in volume. Then, the polymerization of the mixture of monomers proceeds, with the eventual result that, by diffusion, the highly reactive monomer passes to the part of high luminous energy and the lowly reactive monomer passes to the part of low luminous energy. In the meantime, in the part of low luminous energy, the polymerization proceeds, though at a somewhat later time than in the part of high luminous energy. This is because the diethylene glycol-bis(allyl carbonate) present in the recording material as a lowly reactive monomer contains two allyl groups in the molecular unit thereof and further because this lowly reactive monomer gains in polymerizability in the presence of the small amount of the bromine substituted aromatic monomer. As a result, the part of high luminous energy gives birth to a polymer of high refractive index and the part of low luminous energy gives rise to a polymer of low refractive index. Owing to the distribution of composition correspond to that of luminous energy, therefore, the recording material allows real-time recording of a given interference pattern stably in response to the modulation of refractive index.

The method of this invention for holographic recording exhibits the following characteristics.

When the holographic recording material of this invention coated with surface materials is subjected to a heat treatment, the composition constituting the recording material is thermally polymerized to the extent of assuming a highly viscous or virtually solid state. As the result, the surface materials are immobilized to the extent of avoiding relative motion and separation. The dry plate resulting from the treatment mentioned above still retains ample photopolymerizability. When this dry plate is exposed to coherent light to have relevant information written in, the lowly reactive monomer and the highly reactive monomer undergo microscopic distribution correspond to the distribution of luminous energy and allow the information recorded in the form of modulation of refractive index. Moreover, since the composition produces no appreciable flow of its texture and the surface materials retain the thickness of the recording layer uniformly, the pattern is recorded in perfect phase distribution of the type of modulation of refractive index and the diffraction efficiency is improved.

Now, this invention will be described more specifically below with reference to working examples.

EXAMPLE 1

A recording material was prepared with a composition of 22.8 g of diethylene glycol-bis(allyl carbonate), 20.0 g of 2,2-bis[3,5-dibromo-4-(2-methacryloyloxyethoxy)phenyl]propane, 22.0 g of 3-phenoxy-2-hydroxypropyl acrylate, 2.8 g of benzil, 0.9 g of Michler's ketone, and 8.5 g of xylene. It was interposed in a thickness of several $\mu$m between two glass plate 50×60×1.5 mm to produce a holographic recording photosensitive plate. When the photosensitive plate was exposed to an interference pattern formed of He—Cd laser beam, this pattern was successfully recorded by polymerization without any additional treatment. Of course, the dry plate had no need for such operations as development and fixation. Even the lowly reactive monomer part was solidified. Thus, the hologram enjoyed stability. Since the recording layer was kept fast between the two glass plates, the film thickness continued to be uniform even after the exposure to the laser beam. The recording was effected exclusively by virtue of the modulation of refractive index. The exposure was 150 mJ/cm. The recording material thus produced was confirmed to be a transparent hologram showing a diffraction efficiency of 33% in transmission and a resolution of not less than 3,000 lines/mm and showing virtually no sign of absorption in the visible portion.

EXAMPLE 2

A photopolymerizing composition "A" was prepared with 22.8 g of diethylene glycol-bis(allyl carbonate), 20 g of 2,2-bis [3,5-dibromo-4-(2-methacryloyloxyethoxy)-phenyl]propane, 22 g of 3-phenoxy-2hydroxypropyl acrylate, 2.8 g of benzil, 0.9 g of Michler's ketone, and 8.5 g of xylene. Another photopolymerizing composition (B) was prepared with 10 g of diethylene glycol-bis(allyl carbonate), 18 g of 2,2-bis[-3,5-dibromo-4-(2- methacryloyloxyethoxy)phenyl]propane, 9 g of 3-phenoxy-2-hydroxypropyl acrylate, 1.8 g of benzil, and 0.6 g of Michler's ketone. These compositions "A" and "B" were each poured into an intervening space several μm in thickness between two glass plates measuring 50×60×1.5 mm and heat-treated in an oven at 150° C., A for 15 minutes and B for 10 minutes, to produce dry plates. These dry plates, during the course of storage, showed absolutely no sign of monomer crystal exudation. They permitted easy handling, with the glass plates kept fast in place. When the dry plates were exposed to an interference pattern formed of He-Cd laser beam (200 mJ/cm$^2$), the interference pattern was recorded successfully with high repeatability by virtue of photopolymerization after several seconds' to several minutes' exposure without requiring any additional operations such as development and fixation. Consequently there was obtained a stable hologram (efficiency of diffraction about 40% in both A and B). The recording was attained not by surface variation of film but exclusively by modulation of refractive index. This was a transparent hologram showing virtually no sign of absorption in the visible portion.

EXAMPLE 3

A photopolymerizing composition was prepared with 20.0 g of diethylene glycol-bis(allyl carbonate), 25.0 g of 2,2-bis [3,5-dibromo -4-(2-methacryloyloxyethoxy)phenyl]propane, 20.0 g of 3-phenoxy-2-hydroxypropyl acrylate, 9.5 g of triethanol amine, and 0.3 g of methylene blue. A holographic recording dry plate was produced by pouring the composition into a space measuring about 10-odd μm in thickness between two opposed glass plates measuring 50×60×1.5 mm. When this dry plate was exposed (exposure 350 mJ/cm$^2$) to an interference pattern formed of He-Ne laser (wavelength 633 nm), the interference pattern was recorded successfully with high reproducible after several seconds to several minutes of exposure. The recording dry plate effected the recording without requiring additional operations such as development and fixation and the hologram consequently produced enjoyed stability during the course of preservation. The diffraction efficiency was 50% and the resolution was not less than 3,000 lines/mm. This hologram, though occasionally assuming a light blue color, was freed of color by natural light or UV radiation. This was a transparent hologram showing virtually no sign of absorption in the visible portion.

EXAMPLE 4

A photopolymerizing composition was prepared with 20.0 g of diethylene glycol-bis(allyl carbonate), 25.0 g of 2,2-bis [3,5-dibromo -4-(2-methacryloyloxyethoxy)phenyl]propane, 20.0 g of 3-phenoxy-2-hydroxypropyl acrylate, 3.0 g of benzil, 1.2 g of Michler's ketone, and 8.0 g of toluene. A holographic recording dry plate was produced by interposing the composition in a thickness of ten-odd μm between two opposed glass plates measuring 50×60×1.5 mm and heat-treating in an oven at 150° C. for 15 minutes. When the dry plate was exposed (exposure 400 mJ/cm$^2$) to an interference pattern formed of He-Cd laser beam (wavelength 442 nm), the interference pattern was recorded successfully with high repeatability by virtue of photopolymerization. This recording dry plate obviated the necessity for such operations as development and fixation. As concerns the quality of the produced hologram, the diffraction efficiency was not less than 80% and the resolution not less than 3,500 lines/mm.

EXAMPLE 5

A photopolymerizable composition was prepared with 12.0 g of diethylene glycol-bis(allyl carbonate), 12.0 g of 2,2-bis [3,5-dibromo-4-(2-methacryloyloxyethoxy)phenyl]propane, 10.0 g of pentaerythritol triacrylate, 1.6 g of benzil, and 0.6 g of Michler's ketone. A holographic recording dry plate was produced by interposing this composition in a thickness of several μm between two opposed glass plate measuring 50×60×1.5 mm. When the dry plate was exposed (exposure 300 mJ/cm$^2$) to an interference pattern formed with He-Cd laser beam (wavelength 442 nm), the interference pattern was recorded successfully by virtue of photopolymerization after several seconds to several minutes of exposure. As concerns the quality of the produced hologram, the diffraction efficiency was 35% and the resolution not less to than 3,000 lines/mm.

The holographic recording material of this invention induces modulation of refractive index by simply exposing the dry plate to coherent light without requiring the operations of development and fixation which are indispensable to the conventional holographic recording material. It exhibits high diffraction efficiency and high resolution and excels in efficiency of operation. By the method of this invention for holographic recording, since the three-layer structure consisting of a fast surface material, a holographic recording material, and a fast surface material is exposed to the coherent light, the surface materials do not move out of place and keep from soiling the operator's hands during the course of handling. It enables the holographic recording to be obtained in the form of modulation in refractive index with high repeatability and high diffraction efficiency.

What is claimed is:

1. A method for holographic recording, which essentially consists of interposing between two opposed surface materials a holographic recording material comprising diethylene glycol-bis(allyl carbonate) as a principal component, 2,2-bis[3,5-dibromo-4-(2-methacryloyloxyethoxy)phenyl]propane as an auxiliary component, and a photopolymerization initiator, then heating the interposed holographic recording material thereby solidifying said recording material and giving rise to a dry plate, and exposing said dry plate to a coherent light in an interference pattern.

2. A method according to claim 1, wherein the gravimetric ratio of said principal monomer to said auxiliary monomer is in the range of 3:7 to 7:3.

3. A method according to claim 1, wherein said photopolymerization initiator consists of a radical generator possessing the quality of generating the radical of at least one member selected from the group consisting of halogens, aromatic ketones, and peroxides, and a pigment.

4. A method according to claim 1, wherein said photopolymerization initiator is at least one member selected from the group consisting of benzil and Michler's ketone, benzil and acridine yellow, methylene blue and triethanol amine, and halogen compounds and merocyanines.

5. A method according to claim 1, wherein said photopolymerization initiator contains said radical-generating agent in an amount in the range of 0.3 to 10% by weight, based on the total amount of said principal and auxiliary monomers.

6. A method according to claim 1, wherein said pigment is contained in an amount in the range of 0.3 to 10% by weight, based on the total amount of said principal and auxiliary monomers.

7. A method according to claim 1, wherein said recording material further comprises at least one member selected from the group consisting of photopolymerizable monomers liquid at room temperature and organic solvents.

8. A method according to claim 7, wherein said photopolymerizable monomer is at least one member selected from the group consisting of styrene, 2,2-bis(4-methacryloyloxyphenyl)propane, and 3-phenoxy-2hydroxypropyl acrylate, pentaerythritol triacrylate and is contained in up to an amount equalling the total amount of said principal and auxiliary monomers.

9. A method according to claim 7, wherein said organic solvent is at least one member selected from the group consisting of toluene, xylene, acetone, and methyl ethyl ketone and is contained in an amount in the range of 0.5 to 20% by weight, based on the total amount of said principal and auxiliary monomers.

* * * * *